(12) United States Patent
Perry et al.

(10) Patent No.: US 7,961,132 B1
(45) Date of Patent: Jun. 14, 2011

(54) SAMPLING SWITCH AND CONTROLLER

(75) Inventors: Raymond T. Perry, South San Francisco, CA (US); Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 5 days.

(21) Appl. No.: 12/699,794

(22) Filed: Feb. 3, 2010

(51) Int. Cl.
*H03M 1/12* (2006.01)
(52) U.S. Cl. ......................................... 341/172; 341/155
(58) Field of Classification Search .................. 341/155, 341/172, 122, 134, 136, 139, 163
See application file for complete search history.

(56) References Cited

U.S. PATENT DOCUMENTS

| 6,144,330 A * | 11/2000 | Hoffman et al. | 341/166 |
| 6,667,707 B2 * | 12/2003 | Mueck et al. | 341/172 |
| 7,450,041 B2 * | 11/2008 | Lin et al. | 341/118 |

* cited by examiner

*Primary Examiner* — Peguy JeanPierre
(74) *Attorney, Agent, or Firm* — Patent Law Group LLP; Brian D. Ogonowsky

(57) ABSTRACT

In one embodiment, an A/D converter samples an analog input signal voltage by applying the input signal to a first capacitor terminal, while a second capacitor terminal is connected to ground via an NMOS sampling switch, to charge the capacitor to the input signal voltage. During an analog-to-digital conversion process, the second capacitor terminal may swing in a voltage range that extends below ground. A controller circuit provides bias voltage signals to a gate terminal and to a p-well of the NMOS sampling switch, to selectively turn the sampling switch on and off. In a first step of a multi-step sampling process, the controller very quickly discharges the gate terminal to ground to isolate a quantity of charge on the second capacitor plate. In a subsequent step of the sampling process, the controller circuit applies a negative voltage to the gate terminal and p-well to ensure that the quantity of change is substantially preserved during the ensuing analog-to-digital conversion process.

30 Claims, 4 Drawing Sheets

SAMPLING SWITCH AND CONTROLLER

FIELD OF THE INVENTION

This invention relates to analog-to-digital (A/D) converters and, in particular, to a sampling switch in an A/D converter and its controller, wherein the sampling switch can be controlled to be substantially non-conductive for a voltage range that exceeds a power supply voltage range.

BACKGROUND

In a successive approximation register (SAR) analog-to-digital converter, capacitors in a capacitor array are charged to an instantaneous value of an analog input signal voltage at a sampling instant by operation of a sampling switch. To lock in the value of the analog input signal voltage at the sampling instant, the sampling switch is opened. The locked-in value of the analog input signal voltage may be referred to as the sampled analog input voltage. During a subsequent analog-to-digital conversion process, a plurality of conversion switches connected to the capacitors are controlled to effectively generate a series of comparison voltages. The comparison voltages are successively selected, generated, and compared to the sampled analog input voltage to determine whether the sampled analog input voltage is higher or lower than each generated comparison voltage. Each new comparison voltage in a series of comparison voltages is based on comparisons made of the sampled analog input voltage and previous comparison voltages in the series. A series of comparison voltages may start with a first comparison voltage that is in the middle of the highest and lowest values within a nominal analog input voltage range. For example, if the sampled analog input voltage is detected as being higher than the first comparison voltage, a first bit of a digital code is set to a one, and a second comparison voltage in the series of comparison voltages may be generated as the first comparison voltage increased by one fourth (¼) of the span of the nominal analog input voltage range. Continuing the example, if the sampled analog input voltage subsequently is detected as being lower than the second comparison voltage, a second bit in the digital code is set to zero, and a third comparison voltage in the series of comparison voltages may be generated as the second comparison voltage decreased by one eighth (⅛) of the span of the nominal analog input voltage range. By using a successive-approximation algorithm repeatedly (selecting, generating and comparing a series of comparison voltages to successively approximate a sampled analog input voltage) a digital representation of the sampled analog input voltage can be made to have substantially any resolution.

The sampling switch must be substantially non-conductive during the successive-approximation analog-to-digital conversion process, so that the sampled analog input voltage can be preserved and compared accurately to each voltage in the series of comparison voltages. If a junction-isolated MOSFET transistor is used as a sampling switch, its pn junction diodes must not become forward-biased enough to cause substantial conduction when the sampling switch is open, or else the analog-to-digital conversion process may yield an inaccurate result. For example, if the sampling switch is implemented as a junction-isolated NMOS transistor, a pn junction diode formed by a p-doped substrate (or a p-doped well) and an n-doped drain or source region must not become substantially forward-biased during the conversion process. Furthermore, during the analog-to-digital conversion process, a gate voltage applied to the NMOS sampling switch must be sufficiently low to ensure that a conductive channel will not be formed in a p-doped region between the n-doped drain and source regions. These requirements may be difficult to meet when the sampling switch is subject to voltage swings that may exceed an upper and/or a lower boundary of a power supply voltage range.

What is needed is a sampling switch that can be used to accurately sample an analog input signal voltage and remain substantially non-conductive during a period of time when an integrated circuit performs a certain function, for example an analog-to-digital conversion process. What is needed is a sampling switch that can be turned off very quickly, and be controlled to be substantially non-conductive with respect to a predefined voltage range that exceeds a boundary of a power supply voltage range.

SUMMARY

A sampling switch and its controller are described in a context of a successive-approximation-register (SAR) analog-to-digital converter. The invention also applies to other types of analog-to-digital converters, and more generally to any type of sampled-data analog signal processing circuit.

An analog input signal voltage is applied via an input terminal across a capacitor during a tracking mode of operation when a sampling control signal is low. A sampling switch is opened at a sampling instant, marked by a triggering (transition from low to high) of the sampling control signal, which samples (locks in) an instantaneous value of the analog input signal voltage. The instantaneous value of the analog input signal voltage may be referred to as the sampled analog input voltage. At (or shortly after) the sampling instant, an input switch is opened to substantially isolate the capacitor from the input terminal, and an analog-to-digital conversion process of the sampled analog input voltage is then initiated. At the time of triggering the sampling control signal, a function of the sampling switch is to open (to become substantially non-conductive) to effectively isolate, or lock in, a quantity of charge on a plate of the capacitor. The quantity of charge represents the sampled analog input voltage, and it must be substantially preserved (isolated) during an analog-to-digital conversion process. The requirement of isolating the quantity of charge may be difficult to meet when the plate of the capacitor on which the charge is located may swing in a voltage range that exceeds an upper and/or a lower boundary of a power supply voltage range. Such voltage swings may occur during the analog-to-digital conversion process, for example, if the capacitor is coupled between the input terminal and a power supply voltage rail during the tracking mode of operation. Coupling the capacitor between the input terminal and a power supply voltage rail may be preferable for implementing low-power analog-to-digital converters that consume very little power (ideally zero power) during the tracking mode of operation.

In the event the sampling switch becomes substantially conductive during the analog-to-digital conversion process, the isolated quantity of charge may be affected, and the analog-to-digital conversion process may yield an inaccurate result.

In one embodiment of the invention, the sampling switch is implemented as a junction-isolated NMOS transistor implemented in a p-well that can be biased at a voltage that may be substantially different than a voltage that a silicon substrate is biased at. A controller circuit provides biasing voltage signals to a gate terminal of the NMOS transistor and also to the p-well. The biasing voltage signals provided by the controller exceed a power supply voltage range (a range of voltages limited by a low power supply voltage and a high power supply voltage used to power the analog-to-digital converter), in order to prevent a pn junction diode from becoming substantially conductive, and also to prevent a substantially conductive channel from forming under the gate terminal.

A drain terminal and a source terminal of the NMOS transistor are each one of two switch terminals of the sampling switch. During the tracking mode of operation, each of the switch terminals are biased at voltages that are substantially the same as the low power supply voltage. In the tracking mode of operation, the controller couples the gate terminal of the NMOS transistor to the high power supply voltage rail to establish a conductive channel between the switch terminals.

The controller implements a multi-step sampling process. In a first step of the sampling process, the gate terminal of the NMOS transistor is switched very quickly from the high power supply voltage to the low power supply voltage, causing the conductive channel to substantially disappear (making the sampling switch substantially non-conductive). The input switch is opened to substantially isolate the capacitor from the input terminal. In a subsequent step of the sampling process, which occurs before the sampling switch terminals become subject to voltages that may substantially exceed the power supply voltage range, the controller applies a low bias voltage to the gate terminal and to the p-well of the NMOS. The low bias voltage (below the low power supply voltage) is applied to ensure that the sampling switch will remain substantially non-conductive with respect to a nominal range of voltages (exceeding the power supply voltage range) that the switch terminals may become subject to during the analog-to-digital conversion process.

The first step of the sampling process may be completed very quickly (as quickly as the semiconductor process, and other engineering aspects, reasonably allow for) to ensure that the quantity of charge isolated on the capacitor will represent the instantaneous analog input voltage with sufficient accuracy. The speed at which the low bias voltage is subsequently applied to the NMOS switch may not be critical for the overall accuracy of the conversion process, as long as it is done before the switch terminals are made subject to voltages that may otherwise have caused a material change in the quantity of charge isolated on the capacitor. Proper timing may be used to coordinate the sampling process with the analog-to-digital conversion process, to ensure that a digital code provided by the analog-to-digital converter is accurate to within one least significant bit (LSB).

The sampling switch may also be a PMOS transistor or another type of semiconductor device. When using a PMOS sampling switch, the circuit may be implemented in a CMOS process based on a p-doped substrate and providing n-doped wells in the p-doped substrate for the implementation of the PMOS sampling switch.

The invention is also advantageous for controlling a gate terminal of a MOSFET sampling switch implemented in a silicon-on-insulator (SOI) semiconductor process.

BRIEF DESCRIPTION OF THE DRAWINGS

FIG. 7 illustrates the controller of FIG. 5 along with approximate voltage levels during a tracking mode of operation when the sampling switch is on.

Elements that are the same or equivalent are labeled with the same numeral.

DETAILED DESCRIPTION

Figure 1:
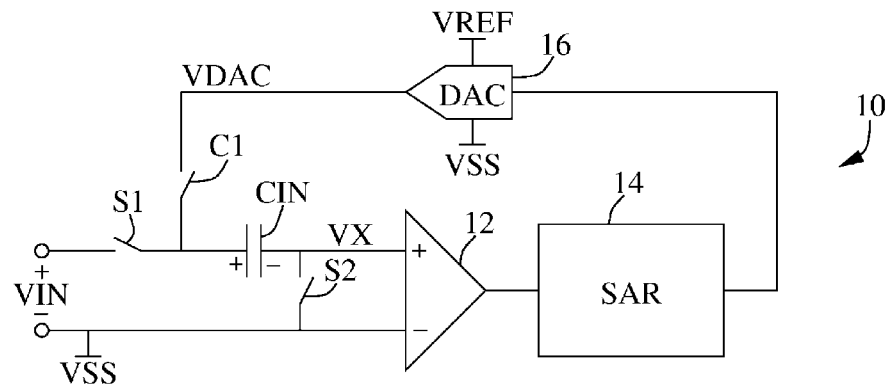
FIG. 1 is a schematic of one type of SAR analog-to-digital converter employing the sampling switch and controller in accordance with one embodiment of the invention.

FIG. 1 illustrates a SAR analog-to-digital converter 10 in accordance with one embodiment of the invention. Many different types of analog-to-digital converter principles and methods may be used with the inventive sampling switch and controller.

The general operation of SAR analog-to-digital converters is well known and extensively described in many publications. Accordingly, only a general description of the operation of a SAR analog-to-digital converter is presented below to provide context for the inventive sampling switch and controller.

In a tracking mode of operation of the analog-to-digital converter 10 shown in FIG. 1, an analog input signal voltage VIN is applied across a capacitor CIN via an input switch SI and a sampling switch S2. Input switch S1 selectively couples an input plate of capacitor CIN to an input terminal. Sampling switch S2 selectively couples a second plate of capacitor CIN to a low power supply voltage rail (VSS=0V). The analog input signal voltage VIN is defined from the input terminal to the low power supply voltage rail (may also be referred to as ground, VSS, or 0V).

In a process of sampling an instantaneous value of the analog input signal voltage VIN, the sampling switch S2 is opened at a sampling instant, which substantially isolates (locks in) a quantity of charge on the second plate of capacitor CIN. The instantaneous value of the analog input signal voltage at the sampling instant may be referred to as the sampled analog input voltage. At (or shortly after) the sampling instant, input switch S1 is opened to substantially isolate capacitor CIN from the input terminal. A conversion switch C1 is then closed to successively apply a series of comparison voltages VDAC to the input plate of capacitor CIN as part of a successive-approximation analog-to-digital conversion process.

At the end of the analog-to-digital conversion process, a digital circuit 14 (that for simplicity and general practice will be referred to as a successive-approximation-register or SAR) provides a digital code representing the sampled analog input voltage with a certain resolution. The resolution may be characterized by a size of a least significant bit (LSB). A maximum digital code represents a high-end boundary of a nominal full-scale input voltage range, which substantially equals a reference voltage VREF. A minimum digital code represents a low-end boundary of the nominal full-scale input voltage range, which substantially equals VSS=0V.

The analog-to-digital conversion process involves a series of evaluations whereby each voltage in a series of comparison voltages is effectively compared to the sampled analog input voltage. Each series of comparison voltages is selected and controlled by the SAR circuit 14. The first voltage in each series of comparison voltages may be a default initial value VREF/2. The second voltage in a series of comparison voltages depends on the first voltage in the series and an outcome of an evaluation performed by a comparator circuit 12. For example, if comparator circuit 12 determines that the sampled analog input voltage is higher that the first voltage in the series of comparison voltages, then SAR 14 will select a second voltage in the series that is higher than the first voltage. In the alternate case, if comparator circuit 12 determines that the sampled analog input voltage is lower than the first voltage in the series of comparison voltages, then SAR 14 will select a second voltage in the series that is lower than the first voltage. The process continues for a number of successive steps of iteration/approximation, wherein SAR 14 selects a third comparison voltage based on an evaluation of the selected second comparison voltage and the sampled analog input voltage; SAR 14 then selects a fourth comparison voltage based on an evaluation of the selected third comparison voltage and the sampled analog input voltage; the approximation process continues in this manner for a number of steps. SAR 14 may use a step size (difference between one comparison voltage and the next comparison voltage in a series) that is a progressively smaller quantity for each step in the approximation process. For example, the step size may be VREF/4 in a first step, VREF/8 in a second step, VREF/16 in a third step, and so on. Accordingly, SAR 14 controls a successive-approximation analog-to-digital conversion process (successively reducing a nominal worst-case absolute difference between the sampled analog input voltage and each voltage in a series of comparison voltages), to determine a digital representation of the sampled analog input voltage. SAR 14 may implement any one of a variety of more-or-less advanced successive-approximation algorithms. Specific details of such algorithms are not important for understanding and/or utilizing this invention.

A digital-to-analog converter (DAC) 16 generates the comparison voltages VDAC selected by SAR 14. A conversion switch C1 is closed during the analog-to-digital conversion process (prefix "C" is used to identify switches that are closed during the analog-to-digital conversion process, and prefix "S" is used to identity switches that are closed during the tracking mode of operation). A comparison voltage VDAC is applied via conversion switch C1 to the input plate of capacitor CIN, and a polarity of a voltage VX (defined with respect to VSS=0V) of the second plate of capacitor CIN is indicative of a difference between the comparison voltage VDAC and the sampled analog input voltage. Specifically, if comparison voltage VDAC is higher than the sampled analog input voltage, then comparator 12 will detect that voltage VX is higher than VSS. SAR 14 uses this determination to select a next comparison voltage.

For an input signal voltage VIN within a full-scale input voltage range from 0V to VREF, voltage VX may swing substantially in a voltage range from −VREF/2 to +VREF/2 during the analog-to-digital conversion process. In the event sampling switch S2 becomes substantially conductive during the conversion process, the quantity of charge nominally isolated on the second plate of capacitor CIN may change, and the analog-to-digital conversion process may yield an inaccurate digital code (result). A digital code may be considered to be inaccurate if it differs from an ideal digital code by more than 1 LSB. An aspect of one embodiment of the invention is that sampling switch S2 will remain substantially non-conductive when the terminals of sampling switch S2 swing in the voltage range from −VREF/2 to +VREF/2. This aspect is an important feature for its use in analog-to-digital converters wherein (as shown in FIG. 1) the sampling switch is biased at a power supply voltage during a tracking mode of operation. DAC 16, SAR 14, and comparator 12 may be in a power-down (or sleep) mode during the tracking mode of operation, whereby the entire circuit 10 may consume very little (substantially zero) power when it is tracking the input signal VIN. A low-power mode of operation may also be used.

Those who are skilled in the art will recognize that capacitor CIN may be implemented as a plurality of capacitors and that DAC 16 and conversion switch C1 may be a plurality of switches controlled to connect individual capacitors in the plurality of capacitors to either the reference voltage VREF or VSS=0V. It will also be recognized that the analog-to-digital converter 10 may easily be generalized to a fully differential circuit structure and/or modified in a number of other ways.

Figure 2:
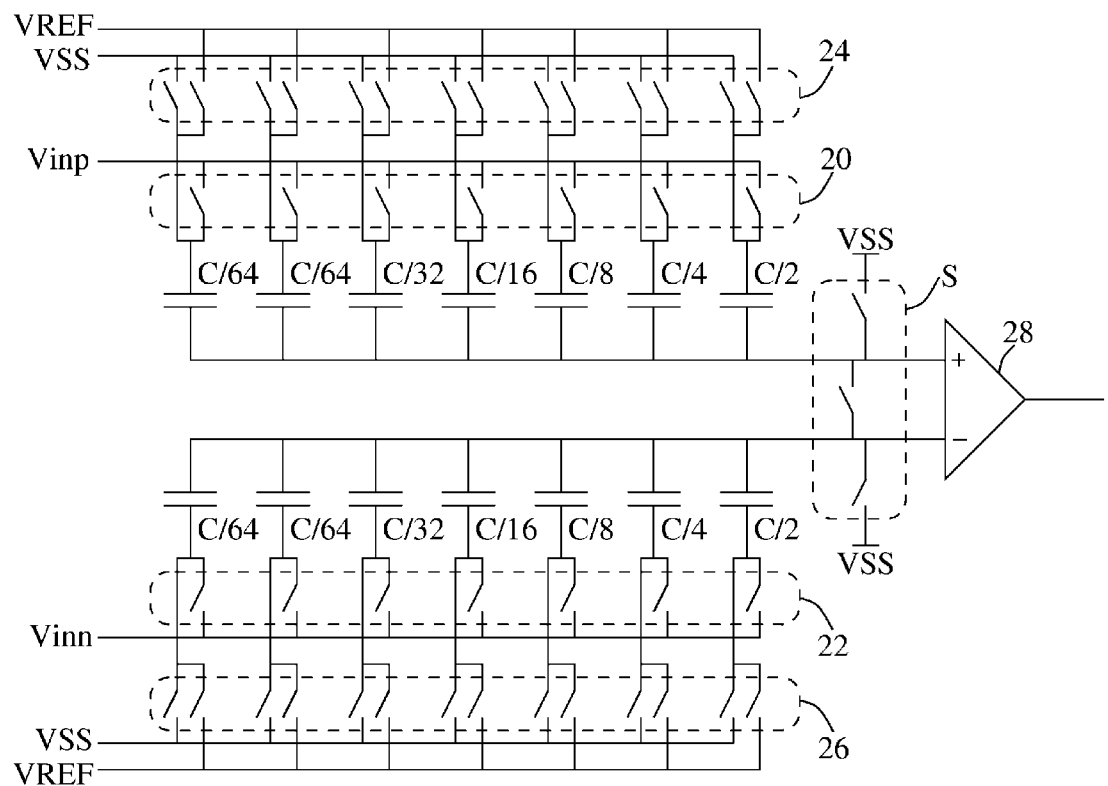
FIG. 2 illustrates in more detail an analog section of a differential SAR analog-to-digital converter employing the sampling switch and controller in accordance with one embodiment of the invention.

FIG. 2 illustrates an analog section of a 6-bit fully differential SAR analog-to-digital converter, having a non-inverting input terminal Vinp and an inverting input terminal Vinn. The analog input signal voltage VIN is fully differential, VIN=Vinp−Vinn, having a common-mode voltage component, VCM=(Vinp+Vinn)/2, that is substantially constant and nominally equal to VREF/2. Each of the two input terminals are coupled to an array of binary-weighted capacitors; each array comprises 7 individual capacitors with relative weights of respectively C/2, C/4, C/8, C/16, C/32, C/64, and C/64. A total capacitance of each array is C. A first array of capacitors is coupled to the non-inverting input terminal Vinp via a first array of input switches 20. A second array of capacitors is coupled to the inverting input terminal Vinn via a second array of input switches 22. Input switches 20,22, serve substantially the same function as input switch S1 in FIG. 1 does. The first array of capacitors is connected to a first array of conversion switches 24. The second array of capacitors is connected to a second array of conversion switches 26. The conversion switches 24, 26 are used to selectively couple individual capacitors in the two arrays of capacitors to either the reference voltage VREF or VSS=0V. Conversion switches 24, 26 serve substantially the same function as switch C1 and DAC 16 in FIG. 1 do. A common plate of the first array of capacitors and a common plate of the second array of capacitors can be selectively connected to one another and to VSS via a plurality of sampling switches marked S in FIG. 2. Sampling switches S in FIG. 2 serve substantially the same function as sampling switch S2 in FIG. 1 does. A comparator 28 in FIG. 2 serves substantially the same function as comparator 12 in FIG. 1 does. A SAR circuit (not shown in FIG. 2) controls conversion switches 24, 26 to effectively apply a series of differential comparison voltages across the first and second arrays of capacitors. During an analog-to-digital conversion process, sampling switches S will be subject to terminal voltages that may swing in a nominal voltage range substantially from −VREF/2 to +VREF/2. Sampling switches S are implemented according to the present invention to facilitate that they are substantially non-conductive when made subject to such terminal voltages during the analog-to-digital conversion process. Further details regarding the operation of a differential SAR A/D converter is provided in U.S. Pat. No. 6,667,707, incorporated herein by reference.

There are several other types of analog-to-digital converters than those described above. FIGS. 1 and 2 are merely examples of circuits in which the present invention may be incorporated advantageously. Sampling switches are also used in many sampled-data analog signal-processing circuits that do not perform a data conversion process (for example, a switched-capacitor filter). Accordingly, sampling switches, S2 in FIG. 1, and S in FIG. 2, and their controller, are in accordance with the present invention. The invention may be incorporated in many different types of circuits and applications.

Figure 3:
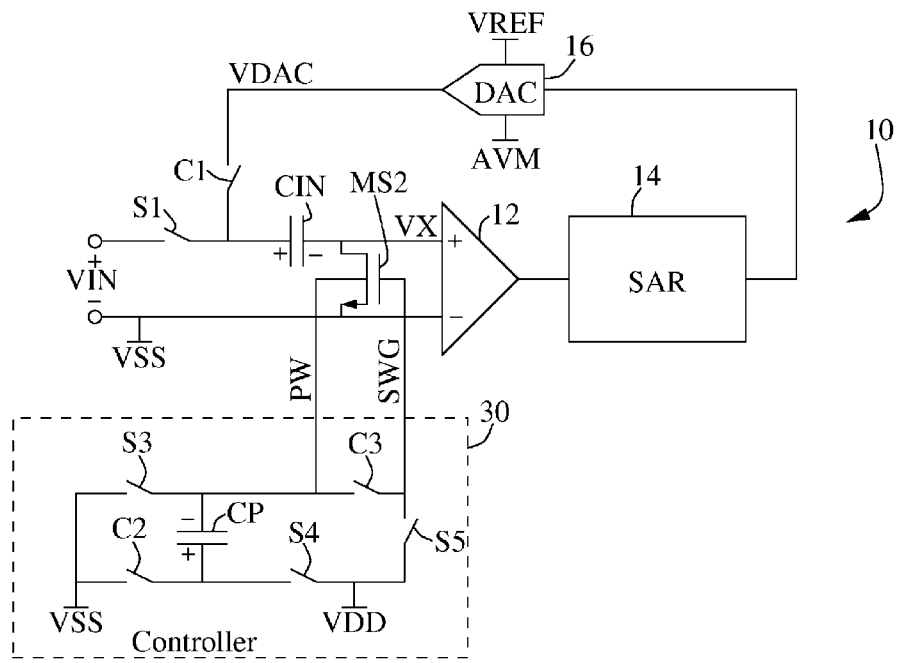
FIG. 3 illustrates the SAR analog-to-digital converter of FIG. 1 with a controller that may be used to provide gate and p-well bias voltage signals to control an NMOS sampling switch in accordance with one embodiment of the invention.

FIG. 3 illustrates the analog-to-digital converter 10 of FIG. 1, wherein sampling switch S2 is implemented as an NMOS transistor MS2. A gate terminal of NMOS MS2 is connected to a node SWG. NMOS MS2 is implemented in a p-well connected to a node PW. A controller circuit 30 applies bias voltage signals to nodes SWG and PW to selectively turn NMOS sampling switch MS2 on and off.

Figure 4:
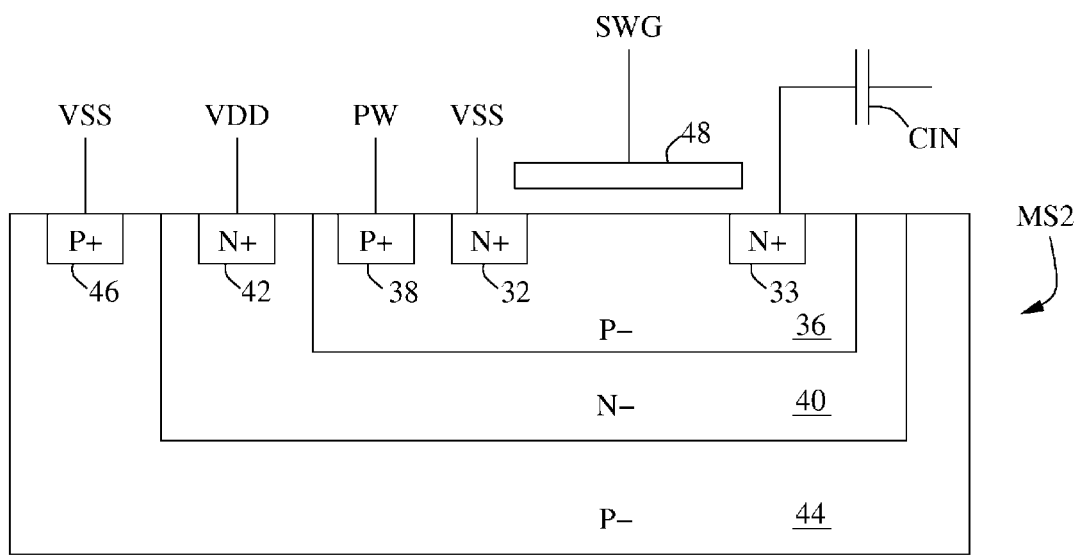
FIG. 4 is a cross-sectional view of a junction-isolated NMOS transistor that may be used as a sampling switch in accordance with one embodiment of the invention.

FIG. 4 shows a cross-sectional view of NMOS transistor MS2. NMOS MS2 has a source region 32 that is strongly doped n-type, and a drain region 33 that is strongly doped n-type. The source and drain regions 32, 33 are formed in a p-well 36 that is lightly doped p-type. The p-well 36 may be formed in any region doped n-type, including an n-type semiconductor substrate. FIG. 4 shows that p-well 36 may be implemented in an n-well 40 that is lightly doped n-type. N-well 40 is implemented in a p-type substrate 44 that is lightly doped p-type. In the application (FIG. 3), source region 32 is connected to VSS=0V, and drain region 33 is connected to capacitor CIN. P-well 36 has a contact region 38 that is strongly doped p-type, which couples p-well 36 to node PW. N-well 40 has a contact region 42 that is strongly doped n-type, which couples n-well 40 to the high power supply voltage rail (VDD). P-type substrate 44 has a contact region 46 that is strongly doped p-type, which couples substrate 44 to the low power supply voltage rail (VSS=0V). A gate terminal (plate) 48 is substantially isolated from an underlying channel region. If gate 48 is biased at a voltage that is high enough to invert the channel region, a conductive channel will be formed between the source and drain regions 32, 33 (effectively turning on the sampling switch NMOS MS2).

To ensure accurate analog-to-digital conversion results, a quantity of charge that is being substantially isolated on the second plate of capacitor CIN (connected to drain region 33) by the sampling process must be preserved during the ensuing analog-to-digital conversion process. The isolated quantity of charge may be detrimentally affected (causing a loss of overall accuracy) if a pn junction diode in an interface region between p-well 36 and n-type drain region 33 becomes substantially forward-biased during the conversion process. To substantially prevent (or limit to an acceptable level) such forward-biasing, node PW and thereby p-well 36 is biased at a negative bias voltage (below VSS=0V) during the analog-to-digital conversion process. The isolated quantity of charge may also be detrimentally affected (causing a loss of overall accuracy) if a substantially conductive channel is established between source and drain regions 32, 33 during the conversion process. To prevent a conductive channel from forming, node SWG and thereby gate 48 is biased at the negative bias voltage during the conversion process. The objective of applying negative voltages to nodes SWG and PW is to preserve the isolated quantity of charge to a degree where any change of such charge will not affect a resulting digital code by more than 1 least significant bit (LSB).

Controller 30 in FIG. 3 applies bias voltage signals to nodes SWG and PW to control sampling switch MS2. During tracking mode of operation, a switch S5 is closed to bias node SWG substantially at the high power supply voltage (VDD). Likewise, during tracking mode of operation, a switch S3 is closed to bias node PW substantially at the low power supply voltage VSS=0V. Furthermore, during tracking mode of operation, a charge pump capacitor CP is charged to the power supply voltage VDD. A positively-charged plate of charge pump capacitor CP is coupled to the high power supply voltage rail VDD via a switch S4, which is closed during tracking mode of operation. A negatively-charged plate of charge pump capacitor CP is connected to node PW, which is coupled to VSS via switch S3 during tracking mode of operation. When a control signal (not shown) is triggered, a sampling process occurs followed by an analog-to-digital conversion process. The sampling process may be described as a three-step process. In a first step of the sampling process, switch S5 is opened and a switch C3 closed, which very quickly changes the bias voltage at node SWG from substantially VDD to substantially VSS. In a second step of the sampling process, switch S3 is opened, whereby nodes PW and SWG are effectively connected to the negatively-charged plate of charge-pump capacitor CP. In the second step of the sampling process, bias voltages at nodes PW and SWG are substantially the same (because switch C3 is closed) and approximately 0V. In a third step of the sampling process, switch S4 is opened and a switch C2 is closed to change the bias voltage of the positively-charged plate of charge-pump capacitor CP substantially from VDD to VSS. The negatively-charged plate of capacitor CP will thereby transition from substantially VSS to a negative bias voltage (below VSS=0V). The negative bias voltage depends on the power supply voltage VDD and also a capacitive loading represented by nodes PW and SWG relative to a capacitance of charge pump capacitor CP. For example, if the capacitive loading represented by nodes PW and SWG is negligible, the negative bias voltage may be substantially minus the power supply voltage (−VDD). For simplicity, and without loss of generality, it will be assumed that the capacitive loading of CP is negligible. Those who are skilled in the art know how to design a charge pump circuit to provide a suitable negative bias voltage to meet specific needs of specific applications. This exemplary embodiment describes a specific charge pump structure that is suitable for this embodiment, as well as many other embodiments. Specifically, the charge pump provides a negative bias voltage of approximately −VDD, which may be sufficiently low to ensure that the isolated quantity of charge is preserved with sufficient accuracy for reference voltages VREF of up to 2VDD. In one embodiment, VDD may be 2.5V and VREF may be 4.096V.

The three-step sampling process facilitates substantially accurate sampling of the analog input signal voltage VIN. The sampling switch MS2 becomes substantially non-conductive during the first step of the sampling process, which advantageously may complete in a very short period of time (for example, a hundred pico seconds, or even faster for some very fast semiconductor technologies). A quantity of charge is thereby substantially isolated on the second plate of capacitor CIN. The second and third steps of the sampling process need not occur similarly fast, as long as they are completed before the drain and/or source terminals of sampling switch MS2 are made subject to voltages that may otherwise have caused a material change in the quantity of charge isolated on CIN. A timing strategy may be used to limit/reduce worst-case voltage swings that may occur at node VX, to ensure that the quantity of charge is substantially isolated until the end of the analog-to-digital conversion process. For example, it may be advantageous to open input switch S1 immediately after (with only little delay) the first step of the sampling process. It may also be advantageous to delay the analog-to-digital conversion process (applying comparison voltages by closing switch C1) until after the three-step sampling process has completed. Depending on specific needs, the three-step sampling process may be designed to complete relatively quickly (in a fraction of a nanosecond), or at a more modest pace (for example, 5 to 10 nanoseconds).

During the analog-to-digital conversion process, switches C1, C2, and C3 are on, and switches S1, S3, S4, and S5 are off. Nodes SWG and PW are biased at a negative bias voltage, which is sufficiently low to ensure that sampling switch MS2 is substantially non-conductive during the analog-to-digital conversion process.

Figure 5:
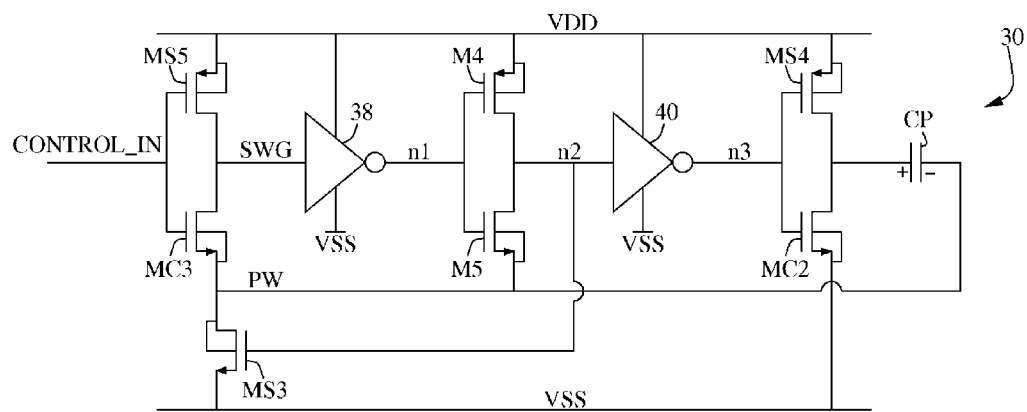
FIG. 5 is a schematic of a controller that provides gate and p-well bias voltage signals to control an NMOS sampling switch in accordance with one embodiment of the invention.

FIG. 5 shows a detailed implementation of controller 30, incorporated in the analog-to-digital converter 10 of FIG. 3. Now comparing FIGS. 3 and 5: switch S5 is implemented as a PMOS transistor MS5; switch C3 is implemented as an NMOS transistor MC3; switch S3 is implemented as an NMOS transistor MS3; switch S4 is implemented as a PMOS transistor MS4; switch C2 is implemented as an NMOS transistor MC2. An applied control signal CONTROL_IN, a first inverter circuit 38, PMOS M4, NMOS M5, and a second inverter circuit 40 are used to provide bias voltages to control transistors MS5, MC3, MS3, MS4, and MC2 to provide the described function of switches S5, C3, S3, S4, and C2.

Figure 6:
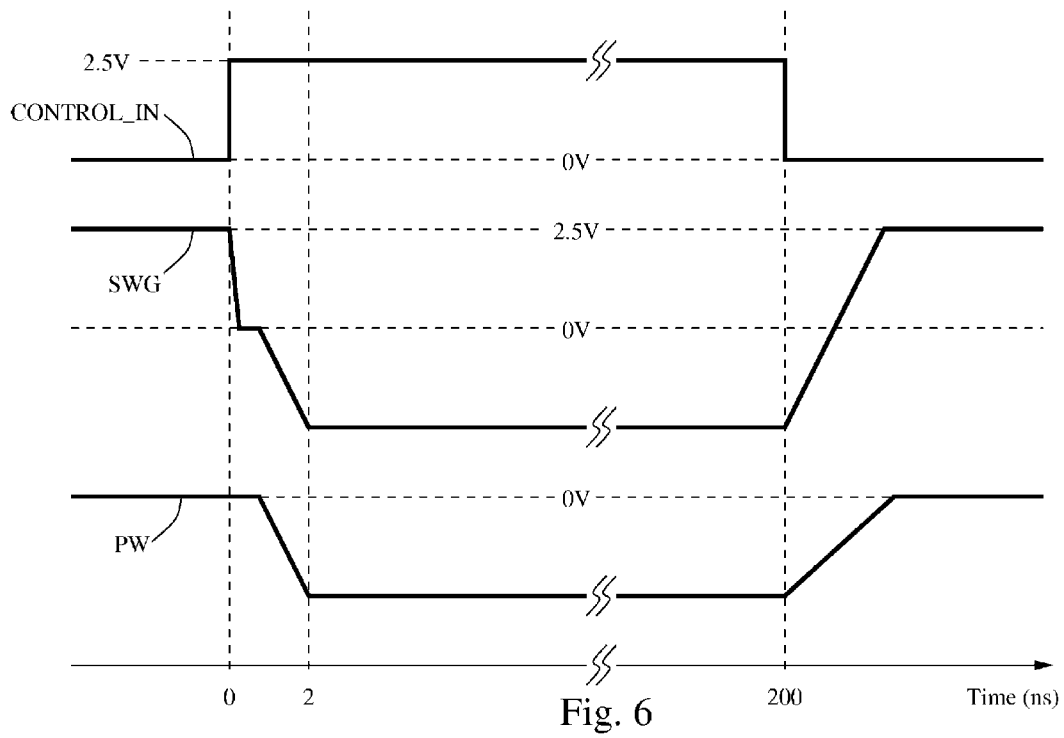
FIG. 6 illustrates simplified waveforms of a control signal and gate and p-well bias voltage signals generated by the controller of FIG. 5 in accordance with one embodiment of the invention.

The operation of controller 30 may be learned more easily by studying FIGS. 3, 5 and 6 in conjunction. FIG. 6 shows simplified waveforms of control signal CONTROL_IN and bias voltage signals at nodes SWG and PW in the controller 30. The low power supply voltage VSS is selected as a reference potential defining 0V, and the high power supply voltage rail VDD is assumed to be 2.5 volts (expressed with respect to VSS=0V).

Control signal CONTROL_IN is low (substantially VSS=0V) during the analog-to-digital converter's 10 tracking mode of operation, and it is high (substantially VDD=2.5V) during the analog-to-digital conversion process. CONTROL_IN transitions from low to high to start the sampling process. A time axis in FIG. 6, using nanoseconds as a unit of time, defines the sampling instant in time as 0.

Figure 7:
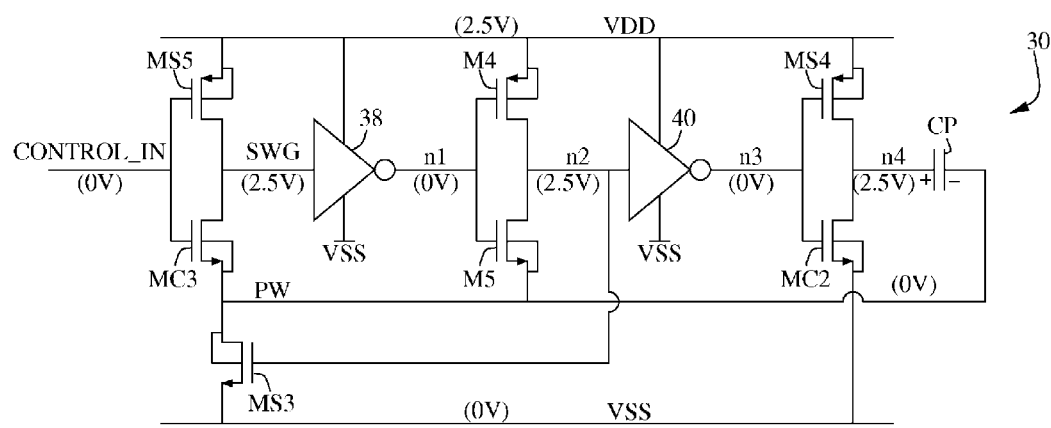

FIG. 7 shows the control circuit 30 of FIG. 5 with additional text labels identifying approximate voltages (enclosed by "("and")") at individual nodes in a steady state when CONTROL_IN has been low for a period of time (tracking mode of operation). CONTROL_IN=0V turns on PMOS MS5, which will charge node SWG to substantially VDD. Inverter 38 translates node SWG as a high input, and drives node n1 to a low level of substantially VSS=0V. The low level at node n1 turns on PMOS M4, which will charge node n2 to substantially VDD. Node n2 is connected to a gate terminal of NMOS MS3, which turns on MS3 and thereby bias node PW at substantially VSS=0V. NMOS MC3 and M5 are off (each device having a gate-to-source voltage of substantially 0V). Inverter 40 translates node n2 as a high input, and drives node n3 to a low level of substantially VSS=0V. PMOS MS4 is on, and NMOS MC2 is off, biasing node n4 (positively-charged plate of capacitor CP) at substantially VDD. Accordingly, node SWG is biased at substantially VDD=2.5V, which is sufficient to turn on sampling switch MS2 (shown in FIG. 3), while the drain and source terminals of MS2 are biased at substantially 0V. Furthermore, node PW is biased at substantially 0V, which will establish a voltage of approximately 0V across pn junction diodes (p-well 36 to n-type drain and source regions 32, 33 in FIG. 4) that are associated with NMOS sampling switch MS2 shown in FIG. 3 (making the pn junctions substantially non-conductive). Charge-pump capacitor CP is being charged to the power supply voltage VDD via PMOS MS4 and NMOS MS3.

As described, FIG. 7 reflects a set of initial conditions for control circuit 30, just before the three-step sampling process is initiated by a transition of CONTROL_IN from low to high (VSS to VDD). When CONTROL_IN goes high, at time 0 in FIG. 6, PMOS MS5 is turned off and NMOS MC3 is turned on. An output voltage at node n1 provided by inverter 38 does not change substantially until after node SWG transitions to below a threshold voltage. Accordingly, in this first step of the sampling process, MS5 is turned off, MS3 remains on, and MC3 is conductive pulling node SWG towards the low power supply voltage rail (via NMOS MS3). NMOS transistors MC3 and MS3 may be sized such that node SWG will transition very quickly from VDD to approximately VSS in the first step of the sampling process.

Transistors M4 and M5 effectively implement the function of a traditional inverter circuit as long as node PW is biased at approximately 0V. Node n2 will, therefore, transition from substantially VDD to VSS a short delay after node SWG transitions from VDD to VSS. The short delay is sufficiently long to allow node SWG to substantially reach a voltage of VSS, thus completing the first step of the sampling process. Transistors MC3 and MS3 couple node SWG to node VSS during the first step of the sampling process. After the short delay, node n2 transitions substantially from VDD to VSS, thereby turning off MS3 and completing the second step of the three-step sampling process. Inverter 40 will then change state and drive node n3 to substantially VDD, thereby turning off PMOS MS4 and turning on NMOS MC2. NMOS MC2 pulls the positively-charged plate of capacitor CP (node n4) substantially from VDD to VSS=0V, causing node PW (connected to the negatively-charge plate of capacitor CP) to transition to a negative bias voltage. MC3 and M5 are conductive during the third step of the sampling process, and nodes SWG and n2 will substantially track the voltage at node PW as it gradually transitions substantially from VSS to the negative bias voltage.

Figure 8:
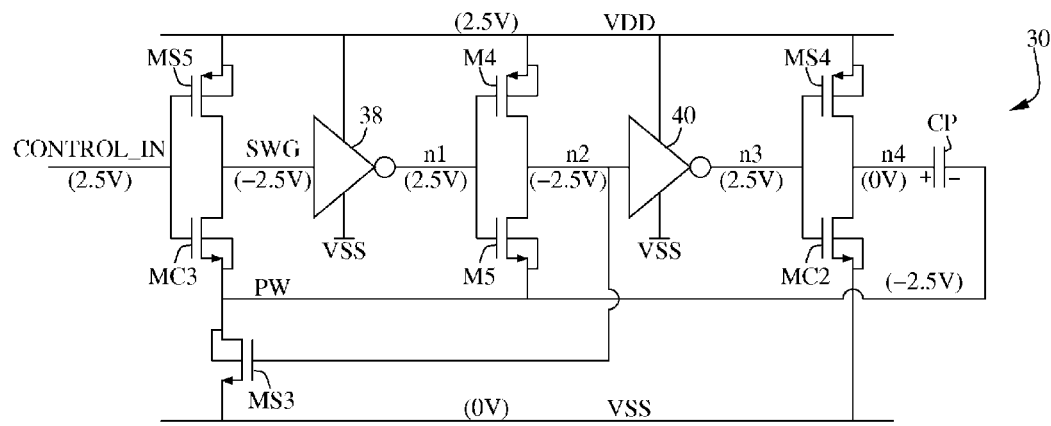
FIG. 8 illustrates the controller of FIG. 5 along with approximate voltage levels during a conversion mode of operation when the sampling switch is off.

FIG. 8 shows the control circuit 30 of FIG. 5 with additional text labels identifying approximate voltages (enclosed by "("and")") at individual nodes in a steady state after the sampling process when CONTROL_IN has been high for period of time (conversion mode of operation). The negative bias voltage is assumed to be −VDD=−2.5V, reflecting a negligible capacitive loading by nodes PW and SWG.

The waveforms shown in FIG. 6 reflect that the sampling switch MS2 may be turned off very quickly (providing a well-defined and accurate sampling of the value of the analog input signal voltage at the sampling instant), by ensuring that the first step in the sampling process happens very quickly. In FIG. 6, the first step of the sampling process takes 250 picoseconds to complete (from the transition of CONTROL_IN), and the overall sampling process is shown to take approximately 2 nanosecond (8 times as long, but only a small fraction of the duration of the analog-to-digital conversion process). A timing of the sampling process can be optimized to meet specific requirements and objectives for different applications.

Inverter 38 provides a CMOS logic signal at node n1 that may be used to control input switch S1 (shown in FIG. 3), such that S1 opens shortly after the first step of the sampling process. Node n4 is a CMOS logic signal that may be used to control the conversion switches (C1 in FIG. 3) and/or SAR 14, such that the first comparison voltage is not applied until after SWG and PW have reached the negative bias voltage to ensure that the sampling switch (MS2 in FIG. 3) will remain substantially non-conductive during the analog-to-digital conversion process.

Control signal CONTROL_IN goes low after the analog-to-digital conversion process is completed, turning on PMOS MS5 and gradually charging node SWG to a voltage of substantially VDD. MS5 may also charge node PW partially via NMOS MC3, but MC3 becomes substantially non-conductive when node PW has been charged to a voltage that is a threshold voltage below VSS=0V. Inverter 38 changes state, providing a low output voltage at node n1, which will turn on M4 and turn off M5. M4 couples the gate terminal of MS3 (node n2) to VDD, turning on MS3 and thereby coupling node PW to VSS=0V. The high level at node n2 causes inverter 40 to drive node n3 to substantially VSS=0V, turning on MS4 and turning off MC2. Accordingly, the charge-pump capacitor is being charged between VDD (via MS4) and VSS (via MS3).

A body terminal of NMOS transistors MC3, MS3, and M5 is connected to node PW. These devices may be implemented using the junction-isolation structure also used for NMOS MS2 (shown in FIG. 4). The body terminal is a representation of the p-well 36 which is biased via contact region 38. The junction-isolation structure may be simplified in another embodiment wherein the sampling switch may be a PMOS transistor, and the overall system may be implemented in a CMOS process based on a p-type substrate in which n-wells are created for the implementation of PMOS devices. Substantially all voltages and doping polarities would be reversed in such an alternative embodiment.

It will be understood that while the sampling process is described herein as a series of three steps (to teach the invention efficiently) the exact same sampling process can be described using fewer or more steps. The number of steps used to describe the sampling process, therefore, should not be construed as limiting the invention, as it can be described and/or modified in any number of ways without departing from the true spirit and scope of the invention.

While particular embodiments of the present invention have been shown and described, it will be obvious to those skilled in the art that changes and modifications may be made without departing from this invention in its broader aspects. Without limitation, such modifications may include incorporating one or more instances of the invention in analog-to-digital converters based on various conversion methods and algorithms (delta-sigma, pipeline, multi-stage, dual-slope, multi-slope, incremental, and so on), and/or incorporating the invention in other types of sampled-data analog signal processing circuits that may not perform an analog-to-digital conversion (for example, an amplifier or a filter). The invention may be implemented in various types of semiconductor processes (CMOS, DMOS, BJT, IGBJT, IGFET, JFET, BCD, and so on), whether or not such processes utilize junction-isolation to isolate individual devices (including, without limitation, silicon-on-insulator technologies), and whether or not such processes are based on a silicon (or, for example, a III-V compound) substrate. The appended claims are to encompass within their scope all such changes and modifications as fall within the true spirit and scope of this invention.

What is claimed is:

1. An analog-to-digital converter configured for sampling an analog input signal and performing an analog-to-digital conversion process to generate a digital code representing a sampled analog input signal value, the analog-to-digital converter comprising:
a capacitor having a first capacitor terminal and a second capacitor terminal, the analog input signal being selectively coupled to the first capacitor terminal and a first voltage being selectively coupled to the second capacitor terminal during a tracking period to acquire the analog input signal to be sampled on the capacitor;
a sampling switch controlled to lock in the sampled analog input signal value, the sampling switch comprising a pn junction diode having a first junction terminal and a second junction terminal, the first junction terminal being coupled to the second capacitor terminal; and
a controller circuit controlling the sampling switch, the controller circuit comprising a charge pump coupled to the second junction terminal, the charge pump configured for providing a second voltage to the second junction terminal during at least a portion of the analog-to-digital conversion process when the analog-to-digital converter is evaluating the sampled analog input signal value, to prevent the pn junction diode from becoming substantially conductive so as not to substantially affect an accuracy of the digital code representing the sampled analog input signal value.

2. The analog-to-digital converter of claim 1 wherein the analog-to-digital converter is a successive approximation register analog-to-digital converter, and wherein the capacitor is one of a plurality of capacitors connected to the sampling switch.

3. The analog-to-digital converter of claim 1 wherein a circuit that is used to evaluate an analog signal during the analog-to-digital conversion process is controlled to be in a power-down mode during the tracking period.

4. The analog-to-digital converter of claim 1 wherein the sampling switch comprises a MOSFET transistor, and wherein the pn junction diode is formed by a well region of a first doping polarity and a drain region of a second doping polarity different from the first doping polarity.

5. The analog-to-digital converter of claim 1 wherein the analog-to-digital converter receives power from a power source providing a first power supply voltage and a second power supply voltage, and wherein said first voltage is substantially the same as the first power supply voltage, and said second voltage exceeds a power supply voltage range limited by the first power supply voltage and the second power supply voltage.

6. The analog-to-digital converter of claim 5 wherein the sampling switch comprises a gate terminal that is biased at a third voltage during at least a portion of the analog-to-digital conversion process when the analog-to-digital converter is evaluating the sampled analog input signal value, and wherein the third voltage exceeds the power supply voltage range.

7. The analog-to-digital converter of claim 5 wherein the charge pump comprises a charge-pump capacitor having a first charge-pump capacitor terminal and a second charge-pump capacitor terminal, where the first charge-pump capacitor terminal is coupled to the first power supply voltage and the second charge-pump capacitor terminal is coupled to the second power supply voltage during at least a portion of the tracking period, and where said second voltage is provided by coupling the first charge-pump capacitor terminal to the second junction terminal.

8. The analog-to-digital converter of claim 1 wherein the analog-to-digital converter comprises a comparator circuit that is in a low-power mode during the tracking period, where a power consumption of the comparator circuit in the low-power mode is at least a factor of ten less than a power consumption of the comparator circuit when it is in an active mode during the analog-to-digital conversion process.

9. The analog-to-digital converter of claim 1 wherein the sampling switch comprises a MOSFET transistor comprising:
a first semiconductor region of a first doping polarity;
a second semiconductor region of a second doping polarity formed in the first semiconductor region, the second semiconductor region being a well region connected to the second junction terminal;

a source region of the first doping polarity formed in the second semiconductor region, the source region being biased at the first voltage during the tracking period;

a drain region of the first doping polarity formed in the second semiconductor region, the drain region being connected to the first junction terminal; and a gate plate proximate to a channel region in the second semiconductor region between the source region and the drain region.

10. The analog-to-digital converter of claim 1 wherein the sampling switch comprises an NMOS transistor, and wherein the second voltage is lower than any voltage provided by a power source providing power to the analog-to-digital converter.

11. The analog-to-digital converter of claim 1 wherein the sampling switch comprises a semiconductor device having a gate terminal, and wherein a first path with controllable conductivity selectively couples the gate terminal to a first power supply voltage to lock in the sampled analog input signal value; and wherein the first path with controllable conductivity is substantially non-conductive during at least a portion of the analog-to-digital conversion process when the analog-to-digital converter is evaluating the sampled analog input signal value.

12. The analog-to-digital converter of claim 11 wherein the first path with controllable conductivity is substantially conductive during a short period of time, where a duration of the short period of time is less than five percent of a minimum period of time used to complete the analog-to-digital conversion process to provide the digital code representing the sampled analog input signal value.

13. The analog-to-digital converter of claim 11 wherein the analog-to-digital conversion process is initiated at a time when the first path with controllable conductivity is substantially non-conductive.

14. A method for processing an analog voltage signal applied at an input terminal, the method comprising the steps of:

step a, selectively coupling the input terminal to a first plate of a capacitor, and selectively coupling a second plate of the capacitor to a first power supply voltage rail via a sampling switch having a control terminal selectively coupled to a second power supply voltage rail;

step b, after step a, applying a control signal to the control terminal to substantially isolate a quantity of charge on the second plate of the capacitor while a voltage potential of the second plate of the capacitor is substantially restricted to be within a power supply voltage range having boundaries corresponding to the first power supply voltage rail and the second power supply voltage rail; and step c, after step b, applying a control bias voltage to the control terminal to continue to isolate the quantity of charge on the second plate of the capacitor while it may swing in an expanded voltage range exceeding the power supply voltage range, the control bias voltage being outside the power supply voltage range;

whereby the quantity of charge isolated on the second plate of the capacitor represents an instantaneous value of the analog voltage signal at a sampling instant.

15. The method of claim 14 further comprising a step d of performing an analog-to-digital conversion process to provide a digital code representing the instantaneous value of the analog voltage signal at the sampling instant.

16. The method of claim 15 wherein the step d comprises the step of applying a series of comparison voltages causing the second plate of the capacitor to swing in a voltage range that exceeds the power supply voltage range for at least some analog voltage signal values within a nominal input range.

17. The method of claim 16 wherein the sampling switch and the control bias voltage are selected to ensure that an error resulting from a detrimental change in the quantity of charge corresponds to a change in the digital code of at most one least significant bit.

18. The method of claim 14 wherein step a comprises the step of charging a second capacitor by selectively coupling a first terminal of the second capacitor to the first power supply voltage rail and selectively coupling a second terminal of the second capacitor to the second power supply voltage rail; and wherein step c comprises the step of coupling the first terminal of the second capacitor to the control terminal.

19. The method of claim 18 wherein step c comprises the step of coupling the second terminal of the second capacitor to the first power supply voltage rail.

20. The method of claim 14 wherein the first plate of the capacitor is substantially isolated from the input terminal in a step initiated in response to completing step b.

21. The method of claim 14 wherein step c further comprises the step of providing a junction bias voltage to a first junction terminal to substantially prevent a pn junction diode configured between the first junction terminal and the second capacitor plate from becoming substantially forward-biased.

22. The method of claim 14 further comprising the step of providing a series connection of a first semiconductor device of a first polarity and a second semiconductor device of the first polarity to selectively couple the control terminal to the first power supply voltage rail, wherein the first semiconductor device is substantially conductive during step a and step b of the method, and wherein the second semiconductor device is substantially conductive during step b and step c of the method.

23. The method of claim 22 further comprising the step of providing a third semiconductor device of a second polarity different from the first polarity, where the third semiconductor device is configured to selectively couple the control terminal to the second power supply voltage rail, and where a gate terminal of the third semiconductor device is coupled to a gate terminal of the second semiconductor device.

24. The method of claim 14 wherein step a comprises the step of placing an analog circuit in a power-down mode, and wherein the method further comprises the step of activating the analog circuit to evaluate the quantity of charge isolated on the second plate of the capacitor.

25. An analog-to-digital converter configured for sampling an analog input signal and performing a successive-approximation analog-to-digital conversion process to generate a digital code representing a sampled analog input signal value, the analog-to-digital converter comprising:

a first capacitor having a first capacitor terminal and a second capacitor terminal, an input switch configured to selectively couple the analog input signal to said first capacitor terminal during a tracking period;

a sampling switch configured to selectively couple the second capacitor terminal to a first power supply voltage during the tracking period;

a controller configured to apply a bias voltage signal to the sampling switch to control a multi-step sampling process, the controller comprising:
a sampling control terminal coupled to the sampling switch for providing the bias voltage signal;
a circuit comprising switches for selectively coupling the sampling control terminal to the first power supply voltage as a step in a multi-step sampling process; and
a charge-pump circuit for pumping the bias voltage signal to a voltage exceeding a power supply voltage range in another step of the multi-step sampling process.

26. The analog-to-digital converter of claim 25 wherein the sampling switch comprises a MOSFET transistor having a gate terminal receiving the bias voltage signal.

27. The analog-to-digital converter of claim 25 wherein the sampling switch comprises a MOSFET transistor implemented in a semiconductor well of a first doping polarity, the bias voltage signal being applied to the semiconductor well.

28. The analog-to-digital converter of claim 25 wherein the capacitor is comprised in an array of capacitors, wherein individual capacitors in the array of capacitors are switched selectively to a reference voltage.

29. The analog-to-digital converter of claim 25 further comprising a comparator circuit, the comparator circuit being in an active mode during the successive-approximation analog-to-digital conversion process, and the comparator circuit being in a power-down mode during the tracking period.

30. The analog-to-digital converter of claim 25 wherein the power supply voltage range is a range of voltages limited by the first power supply voltage and a second power supply voltage; the analog-to-digital converter substantially being powered by the first and second power supply voltages.

* * * * *